(12) United States Patent
Yokoyama et al.

(10) Patent No.: US 6,729,003 B2
(45) Date of Patent: May 4, 2004

(54) PROCESS FOR PRODUCING A CERAMIC ELECTRONIC COMPONENT

(75) Inventors: Hideki Yokoyama, Akita-ken (JP); Takaya Ishigaki, Tokyo (JP); Akira Sasaki, Tokyo (JP); Shintarou Kon, Akita-ken (JP); Tetuji Maruno, Tokyo (JP)

(73) Assignee: TDK Corporation, Tokyo (JP)

(*) Notice: Subject to any disclaimer, the term of this patent is extended or adjusted under 35 U.S.C. 154(b) by 319 days.

(21) Appl. No.: 09/986,416

(22) Filed: Nov. 8, 2001

(65) Prior Publication Data

US 2002/0046861 A1 Apr. 25, 2002

Related U.S. Application Data

(62) Division of application No. 09/618,273, filed on Jul. 18, 2000, now Pat. No. 6,381,118.

(30) Foreign Application Priority Data

Jul. 22, 1999 (JP) .......................................... 11-207818

(51) Int. Cl.$^7$ ................................................ H01G 7/00
(52) U.S. Cl. .................... 29/25.41; 29/25.42; 29/602.1; 29/842; 419/48
(58) Field of Search ........................... 29/25.41, 25.42, 29/602.1, 842, 831; 419/48; 361/303, 305, 306.1, 306.3, 308.1, 309, 310, 321.2–321.5, 322

(56) References Cited

U.S. PATENT DOCUMENTS 4,982,485 A * 1/1991 Nakaya et al. ............. 29/25.42

| | | | |
|---|---|---|---|
| 5,659,456 A | 8/1997 | Sano et al. | 361/321.4 |
| 5,731,950 A | 3/1998 | Sakamoto et al. | 361/321.4 |
| 5,734,545 A | 3/1998 | Sano et al. | 361/321.4 |
| 5,742,473 A | 4/1998 | Sano et al. | 361/321.4 |
| 5,841,626 A | 11/1998 | Sano et al. | 361/321.5 |
| 5,877,934 A * | 3/1999 | Sano et al. | 361/321.5 X |
| 6,151,204 A | 11/2000 | Shigemoto et al. | 361/305 |

FOREIGN PATENT DOCUMENTS

| | | | |
|---|---|---|---|
| JP | 63-17217 | 4/1988 | |
| JP | 1-287910 | * 11/1989 | ................ 29/602.1 |
| JP | 06-342734 | 12/1994 | |
| JP | 08-17139 | 2/1996 | |
| JP | 63-17218 | 4/1998 | |
| JP | 10-154633 | 6/1998 | |
| JP | 10-163067 | 6/1998 | |

OTHER PUBLICATIONS

Hakotani et al, "Cu Internal Electrode Multilayer Ceramic Capacitor", Electronic Manufacturing Technology Symposium, Japan IEMT Symposium 6th IEEE/CHMT International, Apr. 1989, pp. 152–155.*

* cited by examiner

Primary Examiner—A. Dexter Tugbang
(74) Attorney, Agent, or Firm—Oliff & Berridge, PLC

(57) ABSTRACT

A process of producing a ceramic electronic component comprises external electrodes having first electrode layers containing at least a noble metal, cuprous oxide, and glass ingredient electrically connected to internal electrodes comprising a noble metal. As the ceramic electronic components, for example, a multi-layer ceramic capacitor, multi-layer varistor, multi-layer dielectric resonator, multi-layer piezoelectric element, etc. may be mentioned.

6 Claims, 4 Drawing Sheets

PROCESS FOR PRODUCING A CERAMIC ELECTRONIC COMPONENT

This is a Division of application Ser. No. 09/618,273 filed Jul. 18, 2000 now U.S. Pat. No. 6,381,118. The entire disclosure of the prior application(s) is hereby incorporated by reference herein in its entirety.

BACKGROUND OF THE INVENTION

1. Field of the Invention

The present invention relates to a ceramic electronic component having noble metal internal electrodes such as a multi-layer ceramic capacitor, a multi-layer varistor, a multi-layer dielectric resonator, and a multi-layer piezoelectric element and to a process for the production of the same.

2. Description of the Related Art

The increasingly compactness of electronic apparatuses in recent years has led to surface mounted types of components becoming the mainstream of discrete components. Among these discrete components, there is a strong demand for miniaturization of the multi-layer ceramic capacitors used for high/low voltage integrated circuits. To meet with this, there is a demand for external electrodes which are excellent in bondability with electrical circuits, superior in electrical characteristics, reliability, and mechanical characteristics, and high in bonding strength with sintered devices such as multi-layer ceramic capacitor bodies.

In general, a multi-layer ceramic capacitor has a capacitor element body obtained by printing an internal electrode conductive paste made using Pd, Pt, Ag—Pd, or another noble metal on a ceramic green sheet prepared by the doctor blade method, stacking a plurality of these ceramic green sheets, heat compressing these, then firing them. A pair of external electrodes are formed at the two ends of the capacitor element body to connect with the alternately stacked internal electrodes inside the capacitor element body.

As the external electrodes, to improve the affinity with the internal electrodes and prevent poor connection, a conductive paste comprised of a powder of Ag, Pd, Ag—Pd, or other noble metal plus glass frit is coated on the two ends of the capacitor element body, dried, then fired so as to provide first electrode layers having a good bonding state with the internal electrodes. To improve the wettability and solder resistance of the first electrode layers for connection with the conductive pattern of the circuit board on which the device is to be mounted as a multi-layer ceramic capacitor, second electrode layers comprised of a plating film of nickel and third electrode layers comprised of a plating film of tin or tin-lead are provided.

In such conventional external electrodes, however, along with the firing of the first electrode layers, the densification of the organic residue of decomposition of the vehicle included in the conductive paste was inhibited and the tensile strength lowered, so there was a problem in bonding strength with the capacitor element body. If using a noble metal to form the internal electrodes and external electrodes to electrically connect the two strongly in the hopes of obtain a high capacity by the multiple layers in the multi-layer ceramic electronic component and achieve miniaturization of the component, while the characteristics become stable, there are the defects that the bonding of the stacked ceramic body and the external electrodes is weak and therefore the mechanical characteristics become inferior.

On the other hand, Japanese Examined Patent Publication (Kokoku) No. 8-17139 and Japanese Unexamined Patent Publication (Kokai) No. 10-154633 propose to form the internal electrodes by a base metal material such as Ni in order to reduce the costs and to form the first electrode layers of the external electrodes by a conductive material comprised of Ag, Cu, and glass frit to secure the bonding strength with the internal electrodes.

With the external electrodes described in these publications, however, migration of silver occurred between electrodes along with a long period of use in a high temperature, high humidity atmosphere and therefore short-circuits easily occurred in a short period, so miniaturization of the components proved difficult. For example, in the case of a multi-layer ceramic capacitor of a miniature size of a length of 0.6 mm and a width of 0.3 mm, the distance between the pair of external electrodes formed on the two end surfaces of the capacitor element body became 0.3 mm or so at a maximum. This was less than half of the distance between external electrodes formed in a multi-layer ceramic capacitor of an ordinary size of a length of 10 mm and a width of 0.5 mm (0.6 to 0.8 mm), so migration of silver occurred particularly easily.

As opposed to this, Japanese Examined Patent Publication (Kokoku) No. 63-17217 and Japanese Examined Patent Publication (Kokoku) No. 63-17218 propose to form external electrodes by a first layer mainly comprised of silver and including palladium and a second layer of just a silver phase. Further, Japanese Unexamined Patent Publication (Kokai) No. 10-16306 proposes forming a first layer using a mixed metal resinate of silver, silicon, calcium, bismuth, etc. and an organic vehicle and forming a second layer using silver powder, glass frit, and a vehicle.

However, since the first layer was formed by a silver phase alone in each of these, while there was the effect of preventing migration of silver in the external electrodes, it was difficult to improve the bonding strength with the capacitor body.

As the conductive material forming the electrodes, it is originally desirable to use palladium powder, which is resistant to a firing temperature of over 1300° C., excellent in conductivity, and reducible, but palladium is expensive, so normally the internal electrodes are formed by a base metal and the external electrodes are formed by a conductive material mainly comprised of the good conductivity silver powder. With external electrodes formed by a conductive material mainly comprised of silver powder, however, since silver is easily oxidized in a firing furnace of a high temperature and high humidity atmosphere at a temperature near 900° C., it is necessary to add as much as 5 wt % of palladium if considering prevention of oxidation of silver and the manufacturing costs.

Even if about 5 wt % of palladium is added, however, the silver particles continue to be rich, so the silver is oxidized at a high temperature, the ionized silver (Ag+) shifts to a negative potential over a long time, and migration of silver occurs between the external electrodes with the resultant susceptibility to electrical short-circuits.

Therefore, it is necessary to realize external electrodes which can prevent the above migration of silver and ensure the bonding strength with the capacitor body when trying to miniaturize the component while securing the minimum distance between the external electrodes for preventing surface discharge.

SUMMARY OF THE INVENTION

An object of the present invention is to provide a ceramic electronic component having a strong electrical connection between internal electrodes and an external electrode, having a high bonding strength between the external electrode and the multi-layer ceramic body, able to effectively prevent migration of silver, and able to be constructed as an extremely small component and a process for production of the same.

To achieve the above object, the ceramic electronic component of the present invention is characterized by comprising internal electrodes having a noble metal and an external electrode having a first electrode layer containing at least
a noble metal,
cuprous oxide ($Cu_2O$), and
a glass ingredient
electrically connected to the internal electrodes.

Preferably, the ceramic electronic component according to the present invention has a percent composition of cuprous oxide contained in the first electrode layer of 1.0 to 10.0 wt % with respect to the noble metal.

Preferably, the ceramic electronic component according to the present invention has a percent composition of the glass ingredient contained in the first electrode layer of 4.0 to 12.0 wt % with respect to the noble metal and the cuprous oxide.

Preferably, the ceramic electronic component according to the present invention has the external electrode comprising:
a first electrode layer electrically connected to the internal electrodes,
a second electrode layer stacked on the first electrode layer and comprised of a plating film of nickel, and
a third electrode layer stacked on the second electrode layer and comprised of a plating film of tin or tin-lead.

To achieve the above object, the process for production of a ceramic electronic component according to the present invention comprising the steps of:
preparing a conductive paste containing at least a noble metal, copper (Cu), and a glass ingredient;
coating and drying the conductive paste on two ends of a multi-layer ceramic body having internal electrode layers comprised of a noble metal; and
firing the multi-layer ceramic body formed with the conductive paste on its two ends in an air atmosphere at a temperature of 700° C. to 800° C. to form a pair of external electrode layers having first electrode layers containing cuprous oxide ($Cu_2O$) at the two ends of the multi-layer ceramic body.

Preferably, in the process for production of a ceramic electronic component according to the present invention, the percent composition of the copper contained in the conductive paste is 1.0 to 8.0 wt % with respect to the noble metal.

Preferably, in the process for production of a ceramic electronic component according to the present invention, the percent composition of the glass ingredient contained in the conductive paste is 4.0 to 12.0 wt % with respect to the noble metal and copper.

Preferably, the process for production of a ceramic electronic component according to the present invention further comprising the steps of:
forming second electrode layers comprised of a plating film of nickel on the first electrode layers formed at the two ends of the multi-layer ceramic body and
forming third electrode layers comprised of a plating film of tin or tin-lead on the second electrode layers.

The external electrode conductive paste of the ceramic electronic component according to the present invention contains at least a noble metal, copper, and a glass ingredient.

Preferably, the external electrode conductive paste of a ceramic electronic component according to the present invention has a percent composition of copper of 1.0 to 8.0 wt % with respect to the noble metal.

Preferably, the external electrode conductive paste of a ceramic electronic component according to the present invention has a percent composition of the glass ingredient of 4.0 to 12.0 wt % with respect to the noble metal and copper.

Note that in the present invention, the glass ingredient includes glass frit or glass powder etc.

Action

In the a ceramic electronic component according to the present invention, by electrically connecting an external electrode having first electrode layers containing a noble metal, copper, and a glass ingredient to internal electrodes comprised of a noble metal, all of the electrical characteristics of the electrostatic capacity, dielectric loss, insulation resistance, and ESR become superior. Further, since cuprous oxide is mixed in the first electrode layers in the ceramic electronic component according to the present invention, the solder heat resistance of the external electrodes can be remarkably improved, the bonding strength with the multi-layer ceramic body can be raised, the occurrence of migration of copper can be reliably prevented, and further a reduction in size of components can be handled.

In particular, by making the percent composition of the cuprous oxide included in the first electrode layer a specific range, the above actions and effects can be remarkably manifested.

Further, by making the percent composition of the glass ingredient included in the first electrode layer a specific range, the second electrode layers stacked on the first electrode layers and the third electrode layers stacked on the second electrode layers can be uniformly formed and as a result a ceramic electronic component more superior in electrical characteristics and mechanical characteristics can be produced.

In the process for production of a ceramic electronic component according to the present invention, by coating and drying a conductive paste containing at least a noble metal, copper, and a glass ingredient on the two ends of a multi-layer ceramic body having internal electrodes comprised of a noble metal, then firing this under specific conditions to form a pair of external electrode layers having first electrode layers containing cuprous oxide on the two ends of the multi-layer ceramic body, the noble metals of the internal electrodes and an external electrode form strong fused alloys. Therefore, according to the present invention, it is possible to form a ceramic electronic component superior in all of the electrical characteristics of the electrostatic capacity, dielectric loss, insulation resistance, and ESR. Further, in the present invention, since cuprous oxide is mixed in the first electrode layers formed at the two ends of the multi-layer ceramic body, the solder heat resistance of the external electrodes can be remarkably improved, the bonding strength with the multi-layer ceramic body can be raised, the occurrence of migration of copper can be reliably prevented, and further a reduction in size of components can be handled.

In particular, by making the percent composition of the copper included in the conductive paste a specific range, the above actions and effects can be remarkably manifested.

Further, by making the percent composition of the glass ingredient included in the conductive paste a specific range, the second electrode layers stacked on the first electrode layers and the third electrode layers stacked on the second electrode layers can be uniformly formed and as a result a ceramic electronic component more superior in electrical characteristics and mechanical characteristics can be produced.

By including in the conductive paste according to the present invention at least a noble metal, copper, and glass ingredient, it is possible to form an external electrode (first electrode layer) having superior bondability with the internal electrodes and multi-layer ceramic body.

The ceramic electronic component according to the present invention is not particularly limited, but may be for example a multi-layer ceramic capacitor, a multi-layer varistor, a multi-layer dielectric resonator, a multi-layer piezoelectric element, etc.

The present disclosure relates to subject matter contained in Japanese Patent Application No. HEI 11-207818, filed on Jul. 22, 1999, the disclosure of which is expressly incorporated herein by reference in its entirety.

DESCRIPTION OF THE PREFERRED EMBODIMENTS

An embodiment of the present invention will be described below based on the drawings.

Figure 1:
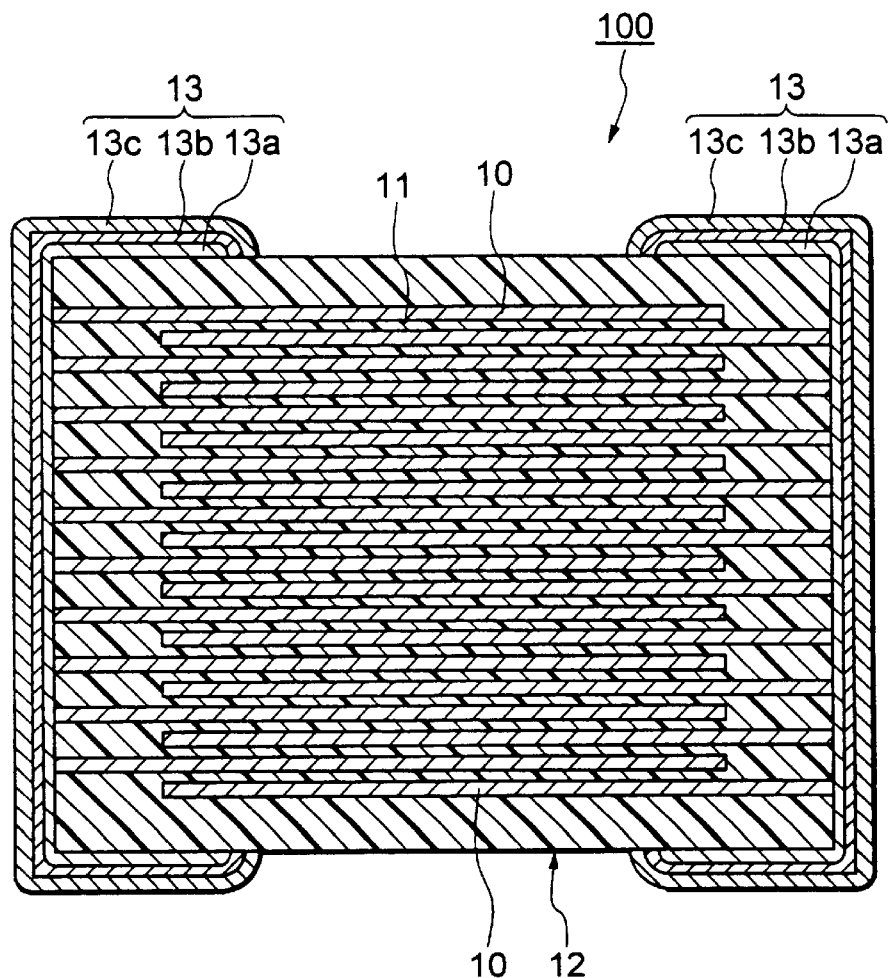
FIG. 1 is a schematic sectional view of a multi-layer ceramic chip capacitor according to an embodiment of the present invention.

In the present embodiment, as the multi-layer ceramic electronic component, the multi-layer ceramic chip capacitor shown in FIG. 1 is illustrated. Its structure and process of production will be explained.

First, the structure of the multi-layer ceramic capacitor will be explained.

As shown in FIG. 1, the multi-layer ceramic chip capacitor 100 illustrated as the multi-layer ceramic electronic component according to an embodiment of the present invention has a capacitor element body 12 comprised of internal electrode layers 10 and dielectric layers 11 alternately stacked on each other. At the two ends of the capacitor element body 12 are formed a pair of external electrodes 13 each connected with the alternately arranged internal electrode layers 10 in the element body 12. The shape of the capacitor element body 12 is not particularly limited, but normally is a parallelopiped. Further, the dimensions are not particularly limited and may be suitably set in accordance with the application, but normally are (0.6 to 5.6 mm)×(0.3 to 5.0 mm)×(0.3 to 1.9 mm) or so.

The internal electrode layers 10 are layers with ends which are alternately exposed at the surfaces of the two facing ends of the capacitor element body 12. The pair of external electrodes 13 are formed at the two ends of the capacitor element body 12 and connected to the exposed end surfaces of the alternately arranged internal electrode layers 10 to constitute the capacitor circuit.

The conductive material included in the internal electrode layers 10 is not particularly limited in the present invention, but a noble metal may be used. As the noble metal used as the conductive material, for example, at least one type selected from palladium (Pd), platinum (Pt), silver/palladium (Ag/Pd), gold (Au), etc. may be mentioned, but Pd or a PD alloy is preferable. The Pd alloy is preferably an alloy of at least one element selected from Ag, Pt, and Au with Pd. The content of the Pd in the alloy is preferably at least 10 wt %. Note that the Pd or Pd alloy may include various trace ingredients up to about 0.1 wt %.

The thickness of the internal electrode layers 10 may be suitably determined in accordance with the application etc., but normally is 0.5 to 5 μm, preferably 1 to 2.5 μm.

The composition of the dielectric layer 11 is not particularly limited in the present invention, but for example may be a lead-based pervoskite, barium titanate-based, strontium titanate-based, or other dielectric ceramic. The thickness of the dielectric layer 11 is not particularly limited, but is generally from several microns to several hundred microns.

In the present embodiment, each of the external electrodes 13 is comprised of a first electrode layer 13a electrically connected to the internal electrode layers 10, a second electrode layer 13b stacked on the first electrode layer 13a, and a third electrode layer 13c stacked on the second electrode layer 13b.

The first electrode layer 13a contains at least a noble metal, cuprous oxide ($Cu_2O$), and a glass ingredient.

As the noble metal, for example, palladium (Pd), platinum (Pt), silver/palladium (Ag/Pd), gold (Au), etc. may be mentioned, but preferably it is at least one type selected from silver (Ag), palladium (Pd), and platinum (Pt).

The cuprous oxide functions to improve the bonding strength with respect to the capacitor element body 12. The percent composition of the cuprous oxide is, with respect to the noble metal, preferably 1.0 to 10.0 wt %, more preferably 1.5 to 9.0 wt %.

As the glass ingredient, for example, a glass frit or a lead-zinc borosilicate based, lead-zinc borate-based, or other glass powder etc. may be mentioned. The percent composition of the glass ingredient is, with respect to the noble metal and cuprous oxide, preferably 4.0 to 12.0 wt %, more preferably 7 wt % (7PHP).

The thickness of the first electrode layer 13a is not particularly limited, but preferably is in the range of 5 to 50 μm.

The second electrode layer 13b is, in the present embodiment, comprised of a plating film obtained by electroplating nickel (Ni), while the third electrode layer 13c is comprised of a plating film obtained by electroplating tin and lead (Sn—Pb).

The thicknesses of the second electrode layer 13b and third electrode layer 13c are not particularly limited, but preferably are in the range of 0.5 to 10 μm.

In the present embodiment, the thickness of the external electrodes 13 may be suitably set in accordance with the application etc., but preferably is in the range of 10 to 50 µm.

Next, an example of the process of production of the above multi-layer ceramic capacitor 100 will be explained.

First, a dielectric layer paste, internal electrode paste, and external electrode paste (conductive paste for first electrode layer 13a) are prepared.

The dielectric layer paste is comprised of an organic solvent-based paste or a water-soluble solvent-based paste obtained by kneading said dielectric material with an organic vehicle. The dielectric material may be suitably selected from various compounds comprised of composite oxides or oxides, for example, carbonates, nitrates, hydroxides, organic metal compounds, etc. and mixed for use. The content of the compounds in the dielectric material should be determined to give the above composition of the dielectric layer after firing. The dielectric material is ordinarily used as a powder of an average particle size of 0.1 to 3.0 µm or so.

The organic vehicle comprises a binder dissolved in an organic solvent. The binder used for the organic vehicle is not particularly limited and may be suitably selected from various types of ordinary binders such as ethyl cellulose and polyvinyl butyral. Further, the organic solvent used at this time is not particularly limited either and should be suitably selected from organic solvents such as terpineol, butyl carbitol, acetone, and toluene in accordance with the method of use such as a printing method or sheet method.

Further, the water-soluble solvent used in the waster-soluble solvent-based paste is comprised of water in which a water soluble binder, dispersant, etc. are dissolved. The water soluble binder is not particularly limited and should be suitably selected from polyvinyl alcohol, methyl cellulose, hydroxyethyl cellulose, a water soluble acrylic resin, an emulsion, etc.

The internal electrode layer paste is prepared by mixing conductive materials comprised of the above various types of conductive metals or alloys or various oxides forming the above conductive materials after firing, organic metal compounds, resinates, etc., and the above organic vehicles.

Further, the external electrode paste of the present embodiment (conductive paste for first electrode layer 13a) contains the external electrode conductive paste of the present invention.

The external electrode conductive paste of the present invention contains the above-mentioned noble metal, a base metal ingredient of copper (Cu), the above-mentioned glass ingredient, and the above-mentioned organic vehicle. By including copper, the bonding strength with the multi-layer ceramic capacitor body 12 can be improved. By including a glass ingredient, the bonding strength with the internal electrode layers 10 can be improved.

The percent composition of the copper with respect to the present invention is preferably 1.0 to 8.0 wt %, more preferably 1.5 to 7.5 wt %. If the percent composition of the copper is smaller than 1.0 wt %, the amount of oxide of the copper after the firing falls, the bonding strength of the multi-layer ceramic capacitor body 12 and the first electrode layer 13a falls, and thermal cracks tend to easily occur in relation to the solder heat resistance. On the other hand, if the percent composition of the copper is more than 8.0 wt %, the firing of the first electrode layers 13a is suppressed and the characteristics deteriorate due to porosification where the electrolyte permeates the layers at the time of wet plating when stacking the second and third electrode layers 13b and 13c explained later, and the bonding strength deteriorates, so it tends to become difficult to form the external electrodes 13.

The percent composition of the glass ingredient with respect to the noble metal and the copper is preferably 4.0 to 12.0 wt %, more preferably 7 wt % (7PHP). If the percent composition of the glass ingredient is less than 4.0 wt %, the bonding strength with the internal electrode layers 10 tends not to be able to be improved. On the other hand, if the percent composition of the glass ingredient is more than 12.0 wt %, it tends to become difficult to uniformly stack the second electrode layers 13b on the first electrode layers 13a obtained by coating, drying, then firing the conductive paste.

The content of the organic vehicle of the above pastes is not particularly limited, but may be made the ordinary content, for example, about 1 to 5 wt % of a binder and about 10 to 50 wt % of a solvent. Further, the pastes may contain, in accordance with need, additives selected from various dispersants, plasticizers, dielectrics, insulators, etc. The total content of these is preferably not more than 10 wt %.

When using the printing method, the dielectric layer paste and the internal electrode layer paste are printed on a substrate of polyethylene terephthalate etc., the substrate is cut to predetermined shapes, then the pastes are peeled off from the substrate pieces to obtain green chips.

When using the sheet method, a dielectric layer paste is used to form a green sheet, the internal electrode layer paste is printed on it, then these are stacked to obtain green chips.

Before firing, the green chips are processed to remove the binder. The processing for removing the binder may be performed under ordinary conditions, but for example may be made an air atmosphere, a rate of temperature rise of preferably 5 to 300° C./hour, a holding temperature of preferably 180 to 400° C., and a temperature holding time of preferably 0.5 to 24 hours.

The oxygen partial pressure in the atmosphere when firing the green chips is preferably made $10^{-14}$ to $10^{-6}$. The holding temperature at the time of firing is preferably 1100° C. to 1400° C.

The other firing conditions are a rate of temperature rise of preferably 50 to 500° C./hour, a temperature holding time of preferably 0.5 to 8 hours, and a cooling rate of preferably 50 to 500° C./hour.

The sintered capacitor element body 12 may further be annealed. The annealing is processing for reoxidizing the dielectric layers. The oxygen partial pressure in the annealing atmosphere is preferably 10 Pa or so. The holding temperature at the time of annealing is preferably 500 to 1100° C. The annealing may be comprised of just a temperature elevating step and a temperature lowering step. That is, the temperature holding time may be made zero. In this case, the holding temperature is the same as the maximum temperature.

The other annealing conditions are a temperature holding time of preferably 0 to 20 hours and a cooling rate of preferably 50 to 500° C./hour.

The processing for removing the binder, firing, and annealing may be performed consecutively or independently. When performing these consecutively, preferably, after the processing for removing the binder, the atmosphere is changed without cooling, then the temperature is raised to the holding temperature for the firing, the firing performed, then the chips are cooled, the atmosphere is changed when the holding temperature of the annealing is reached, and then annealing is performed. On the other hand, when performing these independently, at the time of firing, preferably the temperature is raised to the holding temperature at the time of the processing for removing the binder in a nitrogen gas or wet nitrogen gas atmosphere, then the atmosphere is changed and the temperature is further raised. Preferably, the chips are cooled to the holding temperature of the annealing, then the atmosphere changed again to a nitrogen gas or wet nitrogen gas atmosphere and the cooling continued. Further, at the time of annealing, the temperature may be raised to the holding temperature in a nitrogen gas atmosphere, then the atmosphere changed or the entire annealing process may be performed in a wet nitrogen gas atmosphere.

The thus obtained capacitor element bodies 12 are for example end polished by barrel polishing or sandblasting etc., then printed or transferred with the above external electrode paste and sintered to form the external electrodes 4. The firing conditions of the external electrode paste are for example preferably 700 to 800° C. for 30 minutes to 2 hours or so in an air atmosphere. If the firing is performed in an air atmosphere at a temperature higher than 800° C., the glass ingredient precipitates on the surface of the first electrode layer 13a, the base metal part of copper becomes reduced as copper oxide, the second electrode layer 13b is formed poorly or connected poorly, or the bonding strength between the first electrode layer 13a and the capacitor element body 12 falls. On the other hand, if the firing is performed in an air atmosphere at a temperature lower than 700° C., the alloying is not promoted, so the alloy layer does not become dense and the internal electrode layers 10 and the first electrode layers 13a become poorly connected. Therefore, it is important to set the firing temperature so that the alloying layer becomes dense, cuprous oxide ($Cu_2O$) is mixed in the first electrode layers 13a, and the glass ingredient does not precipitate on the surface.

In the present invention, a second electrode layer 13b comprised of a plating film obtained by electroplating nickel (Ni) etc. is formed on the surface of the first electrode layer 13a formed in this way. A third electrode layer 13c comprised of a plating film obtained by electroplating tin (Sn) or tin-lead (Sn—Pb) is formed on the surface of the second electrode layer 13b.

The thus produced multi-layer ceramic chip capacitor 100 is mounted by soldering etc. on to a printed circuit board for use for various types of electronic equipment.

While an embodiment of the present invention was explained above, but the present invention is not limited to this embodiment in any way. It may of course be worked by various manners within the scope of the gist of the present invention.

For example, in the above embodiment, a multi-layer ceramic chip capacitor was given as an example of the multi-layer ceramic electronic component according to the present invention, but the multi-layer ceramic electronic component of the present invention is not limited to a multi-layer ceramic chip capacitor and may be any device having external electrodes 13 having first electrode layers 13a comprised by a conductive paste of the above composition.

Next, the present invention will be explained in further detail giving examples more specifically embodying the present invention. The present invention, however, is not limited to these example.

As an example, first, a material slurry obtained by mixing a dielectric material mainly comprised of barium titanate, an organic binder, a dispersant, a defoaming agent, etc. was used to prepare a ceramic green sheet.

Next, the ceramic green sheet was printed with a noble metal paste mainly comprised of palladium (Pd) for forming the internal electrodes. Three hundred of these sheets were stacked giving dielectric layers alternating with internal electrodes and then heat compressed.

Next, the heat compressed stack was sintered in a reducing atmosphere at a high temperature, then cut into chips to prepare multi-layer ceramic capacitor bodies of outer dimensions of 1.41 mm×0.77 mm×0.77 mm.

On the other hand, when forming the first electrode layers of the external electrodes, conductive pastes of the compositions shown in Table 1 were prepared. When preparing the conductive pastes of the different samples, the copper (Cu) powder was mixed with the noble metal materials comprised mainly of silver (Ag) powder and the glass powder (fixed 7PHP) and the mixtures made uniform by a kneader and triple roll mill. Next, 20 wt % of an alcohol of butyl carbitol serving as a solvent, 2 wt % of ethyl cellulose serving as an organic binder, an 0.2 wt % of an ethyl type negative ion activant serving as a surfactant were added to the conductive pastes of the different samples. These were mixed by a kneader to adjust the coating viscosity.

As opposed to this, as a comparative example, a conductive paste was prepared by mixing ingredients by the same method as the sample of Example 1 explained above except for mixing a noble metal material mainly comprised of silver (Ag) powder not containing copper (Cu) powder and a glass powder (fixed 7PHP).

TABLE 1

| No. | Cu content (wt %) | Am't of glass added |
|---|---|---|
| Comp. Ex. | 0 | 7 PHP |
| Sample 1 | 1.0 | 7 PHP |
| Sample 2 | 1.5 | 7 PHP |
| Sample 3 | 3.0 | 7 PHP |
| Sample 4 | 5.0 | 7 PHP |
| Sample 5 | 7.5 | 7 PHP |
| Sample 6 | 8.0 | 7 PHP |
| Sample 7 | 8.5 | 7 PHP |
| Sample 8 | 9.0 | 7 PHP |

The obtained conductive pastes were coated and dried on the two ends of the multi-layer ceramic capacitor bodies to thicknesses of about 15 to 20 µm, then sintered in an air atmosphere at about 750° C. to electrically connect the first electrode layers to the internal electrodes.

Next, electroplated films of nickel (Ni) were formed as second electrode layers on the surfaces of the first electrode layers formed and electroplated films of tin (Sn) were formed as third electrode layers on the surfaces of the second electrode layers.

Ten of each of the thus obtained multi-layer ceramic chip capacitor samples were prepared and measured for electrostatic capacity and dielectric loss by applying a voltage of a frequency of 1 kHz and an input voltage of 1V at room temperature. Further, DC voltage of 100V was applied for 20 seconds and the insulation resistance and ESR measured. The results showed that the capacitor samples of Samples 1 to 8 were all free of problems in the electrical characteristics of the electrostatic capacity, dielectric loss, insulation resistance, and ESR.

Further, the solder heat resistances of the capacitor samples of the examples and comparative example were evaluated by immersing the samples in solder solutions of 320°, 350° C., and 400° C. for 3 seconds and examining the electrical characteristics and outer appearances. The results are shown in Table 2.

TABLE 2

| | No. of thermal cracks by heating temperature (3 seconds) | | |
|---|---|---|---|
| No. | 320° C. | 350° C. | 400° C. |
| Comp. Ex. | 0 | 0 | 23 |
| Sample 1 | 0 | 0 | 1 |
| Sample 2 | 0 | 0 | 0 |
| Sample 3 | 0 | 0 | 0 |
| Sample 4 | 0 | 0 | 0 |
| Sample 5 | 0 | 0 | 0 |
| Sample 6 | 0 | 0 | 0 |
| Sample 7 | 0 | 0 | 3 |
| Sample 8 | 0 | 0 | 5 |

Figure 2:
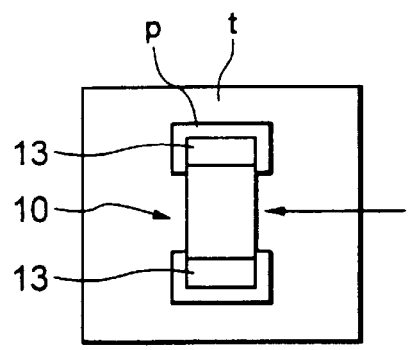
FIG. 2 is an explanatory view of a bonding strength test of capacitor samples of examples of the invention and a comparative example.

Further, as shown in FIG. 2, capacitor samples of the examples and comparative example were soldered to a conductive pattern p of a test board t and tested by gradually giving pressure by a pressing jig at the center of the sides from the horizontal direction to evaluate the bondability of the external electrodes, and investigated as to the strength at the time of breakage. The results are shown in FIG. 3.

Figure 3:
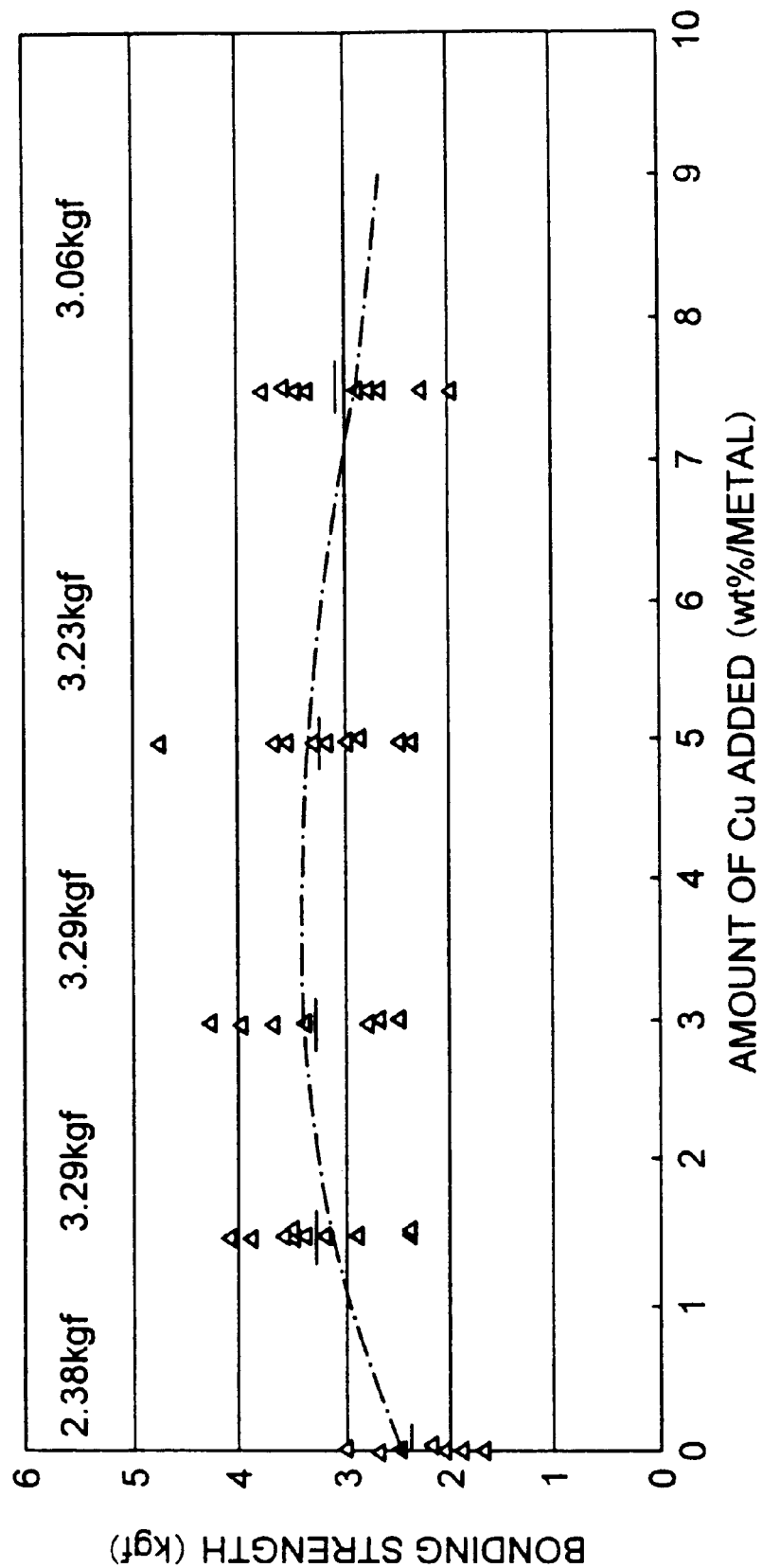
FIG. 3 is a graph of the bonding strength of the capacitor samples of examples of the invention and a comparative example.

Note that in FIG. 3, the points of the bonding strength found from the 10 samples of the capacitor samples of the examples and comparative example are shown by triangular marks. The mean values of the bonding strengths are shown by the horizontal lines positioned approximately at the centers of the string of points.

As clear from the above test data, at least in the capacitor samples using Samples 2 to 6, as seen from the rate of occurrence of thermal cracks, there was a remarkable improvement in the solder heat resistance compared with the sample of the comparative example even at 400° C. The bonding strength was also evaluated as being over 3.0 kg, that is, an extremely high bonding strength could be confirmed to be exhibited.

As opposed to this, in the capacitor sample using the sample of the comparative example, as shown in Table 2 and FIG. 3, the thermal cracks and bonding strength were poor and problems could be observed in the solder heat resistance and bondability. Therefore, the other evaluation tests were omitted.

To further delve into the factors behind this, the external electrodes of the capacitor samples of the examples and comparative example were polished and the degree of oxidation of the copper (Cu) in the external electrodes was investigated by EPMA analysis of the polished surfaces. The results for the capacitor sample of Sample 4 (Ag:Cu=95:5 wt %) are shown in FIGS. 4A to 4D, while the results for the capacitor sample of the comparative example (Ag:Cu=100:0 wt %) are shown in FIGS. 5A to 5D.

Figure 4A:
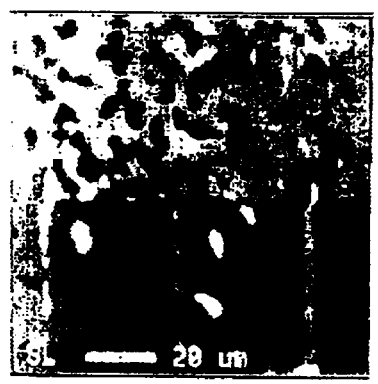
FIG. 4A gives a SEM image of a boundary portion between the internal electrodes and the external electrode (first electrode layer) of the capacitor sample 4 of an example of the invention.
Figure 4B:
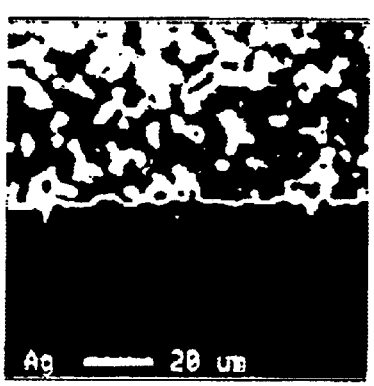
FIG. 4B gives an Ag extraction image of the SEM image.
Figure 4C:
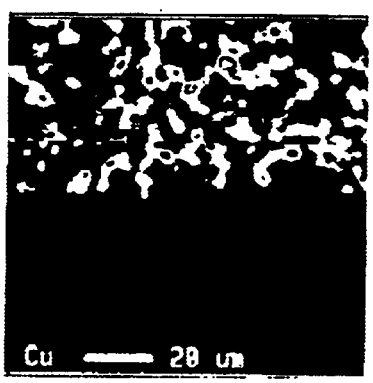
FIG. 4C gives a Cu extraction image of the SEM image.
Figure 4D:
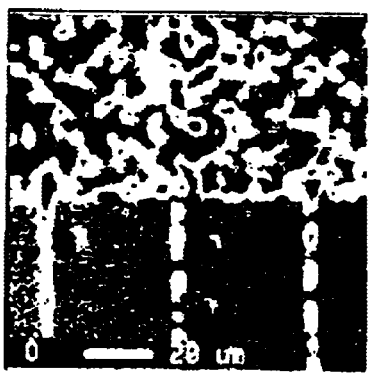
FIG. 4D gives an O extraction image of the SEM image.
Figure 5A:
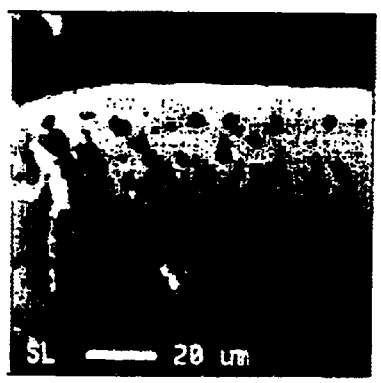
FIG. 5A gives a SEM image of a boundary portion between the internal electrodes and the external electrode (first electrode layer) of the capacitor sample of the comparative example.
Figure 5B:
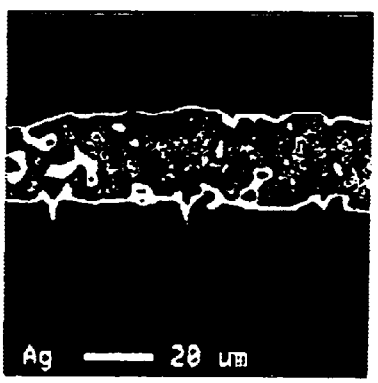
FIG. 5B gives an Ag extraction image of the SEM image.
Figure 5C:
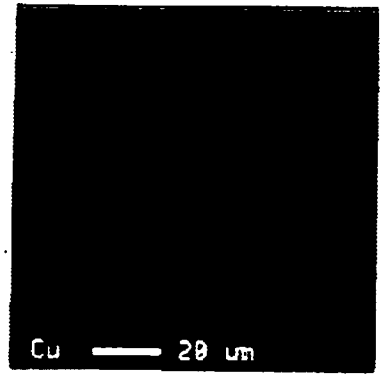
FIG. 5C gives a Cu extraction image of the SEM image.
Figure 5D:
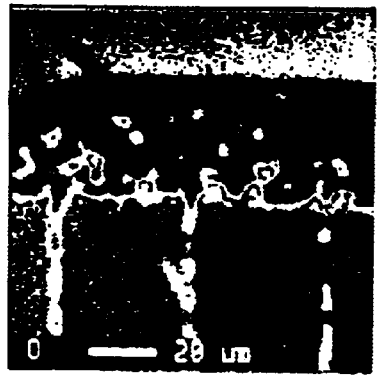
FIG. 5D gives an O extraction image of the SEM image.

As shown in FIG. 4C, it is learned from the capacitor sample of Sample 4 that cuprous oxide ($Cu_2O$) is mixed in the alloy layers forming the first electrode layers and it could be confirmed that cuprous oxide ($Cu_2O$) remarkably improved the solder heat resistance of the external electrodes and increased the bonding strength of the external electrodes by the action of fusing the multi-layer ceramic capacitor body and glass ingredient. Further, in the capacitor sample of Sample 4, since the internal electrodes were mainly comprised of palladium and the first electrode layers were mainly comprised of silver, both noble metals, the noble metals formed strong fused alloys with each other and thereby enabled excellent electrical connection and thereby superiority in all of the points of electrical and mechanical characteristics.

Note that the capacitor samples of Samples 7 and 8 were, conversely, inferior in the points of the thermal cracks and bonding strength and were problematic in the solder resistance and bondability due to being rich in copper. This was believed because the amount of production of the cuprous oxide ($Cu_2O$) was small, that is, a large amount of copper oxide (CuO) was produced, and the ionization tendency of the copper is larger than that of the noble metal silver.

From the above, it could be confirmed that it was preferable to form, as the external electrodes, first electrode layers by electrode layers of an alloy containing cuprous oxide ($Cu_2O$) using a conductive paste comprised of a conductive material containing 1.0 to 8.0 wt % of copper in terms of the percent composition of copper (Cu) to the main ingredient, silver, plus a glass frit.

What is claimed is:

1. A process for production of a ceramic electronic component comprising the steps of:

preparing a conductive paste containing at least a noble metal, copper (Cu), and a glass ingredient;

coating and drying the conductive paste on two ends of a stacked ceramic body having an internal electrode layer comprised of a noble metal; and firing the stacked ceramic body formed with the conductive paste on two ends of the stacked ceramic body in an air atmosphere at a temperature of 700° C. to 800° C. to form a pair of external electrode layers having first electrode layers containing cuprous oxide ($Cu_2O$) at the two ends of the stacked ceramic body.

2. The process for production of a ceramic electronic component as set forth in claim 1, wherein a percent composition of the copper contained in the conductive paste is 1.0 to 8.0 wt % with respect to the noble metal.

3. The process for production of a ceramic electronic component as set forth in claim 2, wherein a percent composition of the glass ingredient contained in the conductive paste is 4.0 to 12.0 wt % with respect to the noble metal and copper.

4. The process for production of a ceramic electronic component as set forth in claim 3, further comprising the steps of:

forming second electrode layers comprised of a plating film of nickel on the first electrode layers formed at the two ends of the stacked ceramic body and forming third electrode layers comprised of a plating film of tin or tin-lead on the second electrode layers.

5. The process for production of a ceramic electronic component as set forth in claim 2, further comprising the steps of:

forming second electrode layers comprised of a plating film of nickel on the first electrode layers formed at the two ends of the stacked ceramic body and forming third electrode layers comprised of a plating film of tin or tin-lead on the second electrode layers.

6. The process for production of a ceramic electronic component as set forth in claim 1, further comprising the steps of:

forming second electrode layers comprised of a plating film of nickel on the first electrode layers formed at the two ends of the stacked ceramic body and forming third electrode layers comprised of a plating film of tin or tin-lead on the second electrode layers.

* * * * *